(12) United States Patent
Kargl et al.

(10) Patent No.: US 6,897,719 B2
(45) Date of Patent: May 24, 2005

(54) DEMODULATION CIRCUIT AND DEMODULATION METHOD

(75) Inventors: Walter Kargl, Graz (AT); Mario Kupnik, Leoben (AT); Ernst Neuhold, Hausmannstätt (AT)

(73) Assignee: Infineon Technologies AG, Munich (DE)

( * ) Notice: Subject to any disclaimer, the term of this patent is extended or adjusted under 35 U.S.C. 154(b) by 153 days.

(21) Appl. No.: 10/320,949

(22) Filed: Dec. 16, 2002

(65) Prior Publication Data

US 2003/0112062 A1 Jun. 19, 2003

Related U.S. Application Data

(63) Continuation of application No. PCT/DE01/02100, filed on Jun. 5, 2001.

(30) Foreign Application Priority Data

Jun. 14, 2000 (DE) .......................................... 100 29 271

(51) Int. Cl.$^7$ ................................................. H03D 1/00
(52) U.S. Cl. ........................ 329/347; 329/349; 329/350; 329/363; 329/366
(58) Field of Search ................................ 329/347, 349, 329/350, 363, 366, 365

(56) References Cited

U.S. PATENT DOCUMENTS

| | | | |
|---|---|---|---|
| 3,895,298 A | 7/1975 | Schollmeier | ................. 375/226 |
| 4,706,262 A | 11/1987 | Ohta | ............................ 375/297 |
| 4,737,730 A | 4/1988 | Ishiwata et al. | .............. 327/58 |
| 4,853,643 A | 8/1989 | Herleikson | ................... 329/353 |

FOREIGN PATENT DOCUMENTS

| | | |
|---|---|---|
| DE | 2 003 093 | 8/1970 |
| EP | 0 524 008 A1 | 1/1993 |
| JP | 11 148 950 A | 6/1999 |

*Primary Examiner*—Arnold Kinkead
(74) *Attorney, Agent, or Firm*—Laurence A. Greenberg; Werner H. Stemer; Ralph E. Locher

(57) ABSTRACT

Two capacitors are provided for demodulating an amplitude-modulated signal and can be supplied with a signal that is rectified by a diode and that is at a voltage. The half-cycles of this signal are used for alternately charging the first or second capacitor using a switch. The capacitors are discharged using switches. Comparing the amplitude values, which are stored in the capacitors, of successive half-cycles in an evaluation unit allows simple and precise demodulation, which can be achieved with few components and can be carried out at very high frequencies.

6 Claims, 2 Drawing Sheets

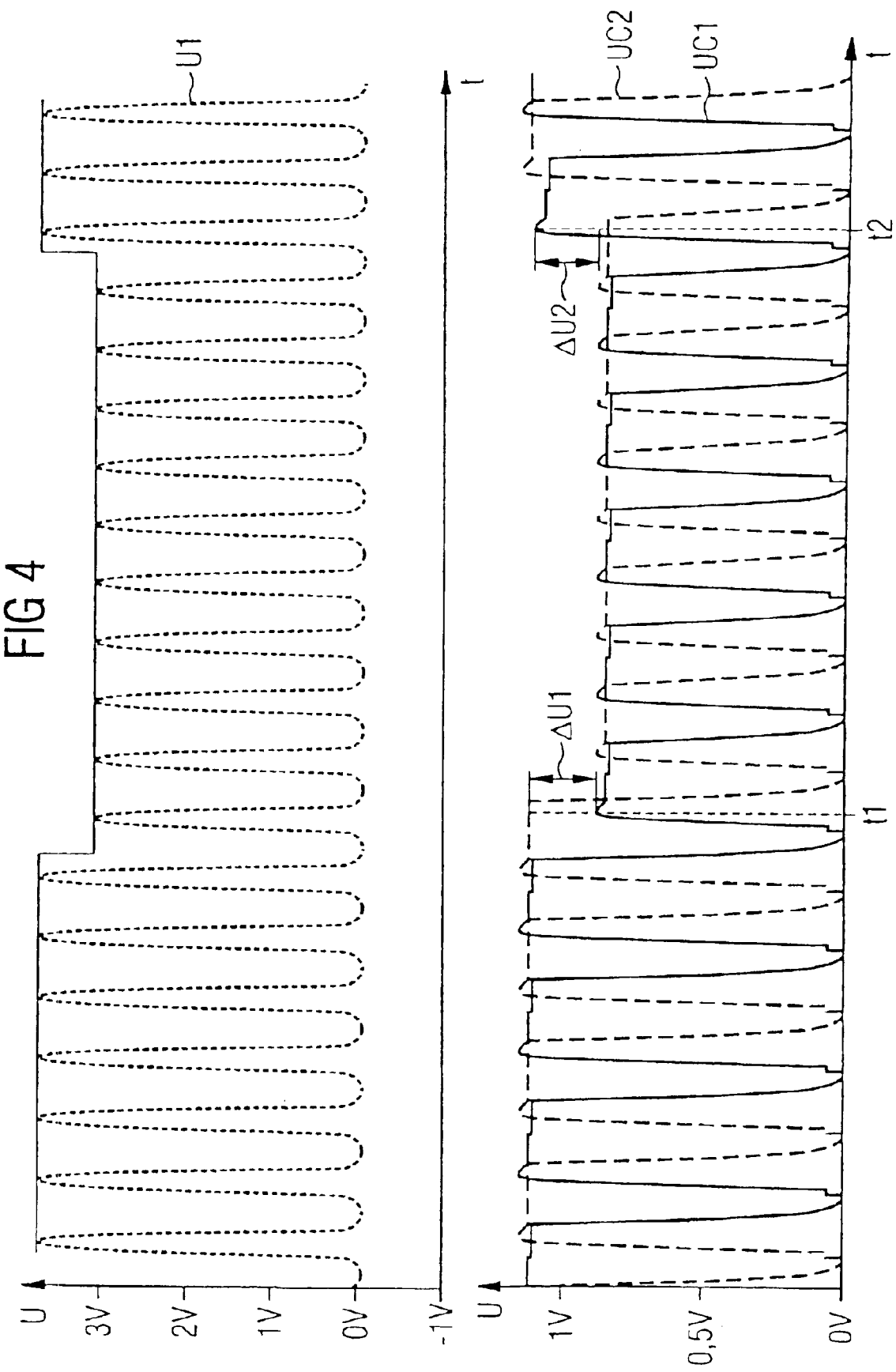

DEMODULATION CIRCUIT AND DEMODULATION METHOD

CROSS-REFERENCE TO RELATED APPLICATION

This application is a continuation of copending International Application No. PCT/DE01/02100, filed Jun. 5, 2001, which designated the United States and was not published in English.

BACKGROUND OF THE INVENTION

FIELD OF THE INVENTION

The present invention relates to a circuit configuration and to a method for demodulating an amplitude-modulated (AM) signal.

As is known, for amplitude modulation, the amplitude of a sinusoidal oscillation that has a carrier frequency is modulated in order to transmit information. A change in the amplitude of the modulated signal is detected and evaluated in a demodulator.

Because of the ever increasing amounts of data that needs to be dealt with in communication technology, there is a trend toward ever higher transmission frequencies. Modulators and demodulators have to be able to satisfy the requirements for ever higher frequencies. In the process, the circuits for modulation and demodulation of an amplitude-modulated signal must function for different duty ratios. The duty ratio of a square-wave signal is the quotient of the time duration from the rising flank to the falling flank and the time duration from the rising flank to the next rising flank.

A known peak value detector of simple construction has a diode that is connected in the forward-bias direction, to whose input an amplitude-modulated signal which is being demodulated can be supplied, and at whose output a capacitor C is connected to ground, in parallel with a resistor R. If the time constant $\tau$ is chosen appropriately, where $\tau = R \times C$, the desired, demodulated signal is produced across the capacitor C or resistor R. In the case of digital amplitude modulation, this signal is normally a square-wave signal. The duty ratio of this square-wave signal is not a priori known, since it depends on the information being transmitted. The time constant $\tau$ in this case influences the discharge time of the capacitor C. The described peak-value detection is not suitable for demodulating an amplitude-modulated signal at a carrier frequency in the range of several tens of Megahertz, since it appears to be virtually impossible to design the circuit, in particular the setting of a suitable time constant $\tau$, such that the circuit operates for the widely differing duty ratios. This is because, if $\tau$ is set to be too long, no significant voltage change takes place at the output of the demodulator. If, on the other hand, $\tau$ is chosen to be too short, although the output signal follows the modulation signal, it disadvantageously has radio-frequency oscillation superimposed on it. This makes simple evaluation of the signal impossible, since, when the modulation signal is compared with a reference voltage for detection of high and low states, there are no significant intersections for a level change.

SUMMARY OF THE INVENTION

It is accordingly an object of the invention to provide a demodulation circuit and a method for demodulating an amplitude-modulated signal, which overcome the above-mentioned disadvantages of the prior art apparatus and methods of this general type.

In particular, it is an object of the invention to provide a demodulation circuit of simple design and a simple demodulation method, which are each suitable for high frequencies.

With the foregoing and other objects in view there is provided, in accordance with the invention, an amplitude demodulation circuit including: a signal input for obtaining an amplitude-modulated signal; a first capacitor for obtaining a signal derived from the amplitude-modulated signal, the first capacitor having a first connection connected to ground, the first capacitor for supplying a first voltage being tapped off across the first capacitor; a first discharging apparatus connected in parallel with the first capacitor; a second capacitor for obtaining a signal derived from the amplitude-modulated signal, the second capacitor having a first connection connected to ground, the second capacitor for supplying a second voltage being tapped off across the second capacitor; a second discharging apparatus connected in parallel with the second capacitor; a device for alternately storing rectified successive half-cycles of the amplitude-modulated signal on the first capacitor and the second capacitor, the device coupling the first capacitor and the second capacitor to the signal input; and an evaluation unit for comparing the first voltage and the second voltage and for supplying an amplitude-demodulated signal derived from the amplitude-modulated signal.

In accordance with an added feature of the invention, the device includes a first diode.

In accordance with an added feature of the invention, there is provided, a third switch configured between the first diode and the first capacitor and between the first diode and the second capacitor. The third switch has a first switch position for connecting the first diode to the first capacitor and a second switch position for connecting the first diode to the second capacitor.

In accordance with an additional feature of the invention, there is provided, a second diode for obtaining the amplitude-modulated signal. The second diode connected to the second capacitor.

In accordance with another feature of the invention, the first discharging apparatus is an NMOS transistor switch; and the second discharging apparatus is an NMOS transistor switch.

With the foregoing and other objects in view there is provided, in accordance with the invention, a method for demodulating an amplitude-modulated signal, which includes steps of: supplying the amplitude-modulated signal to a first diode; obtaining a rectified signal by rectifying the amplitude-modulated signal; charging a first capacitor to a first capacitor voltage with a first half-cycle of the rectified signal; charging a second capacitor to a second capacitor voltage with a second half-cycle of the rectified signal; comparing the first capacitor voltage and the second capacitor voltage and detecting any amplitude change; discharging the first capacitor; and discharging the second capacitor.

In accordance with an added mode of the invention, the method includes alternately connecting immediately successive half-cycles of the rectified signal to the first capacitor and to the second capacitor.

The circuit configuration is based on the higher-level principle that peak-value detection is provided using switchable time constants.

The present circuit configuration has a first diode, downstream from which a capacitor is connected to ground, in which case the capacitor can be discharged using a switch. If, by way of example, the first diode is supplied with a sinusoidal signal, then the diode acts in the manner of a switch such that only the positive half-cycles are in each case passed on, and are thus supplied to the capacitor. In consequence, the capacitor is in each case charged to the peak value of the positive half-cycle. In order to make it possible to detect peak values of subsequent half-cycles as well, the capacitor can be discharged using the first discharging apparatus, which may be a switch and which is arranged in parallel with the first capacitor. The peak value of one half-cycle can thus be determined reliably even when this peak value is less than that of a preceding half-cycle. The switch can be closed during the phase in which the diode is reverse-biased, in order to discharge the capacitor. The voltage that is present across the capacitor can be evaluated between the charging of the capacitor to a voltage value that corresponds to the peak value of one half-cycle and the discharging of the capacitor using the switch.

In comparison to a conventional peak-value detector with a resistor via which the capacitor can be discharged, the present configuration has the advantageous fundamental principle that it is possible to switch between time constants. The switch that is arranged in parallel with the capacitor, as well as the diode, which in conjunction with an AC (alternating) input voltage acts as an implicit switch, are provided for this purpose.

The described principle of a demodulation circuit and of a demodulation method has the advantage that it can be implemented easily and with little complexity, and is suitable for high frequencies.

Furthermore, a second capacitor is provided, to which the rectified signal can be supplied, across which a voltage can be tapped off. One connection of the capacitor is connected to ground. A second discharging apparatus is connected in parallel with the second capacitor, and an evaluation device is provided for comparing the voltages across the first and second capacitors, across which a demodulated signal can be tapped off.

This demodulation circuit is based on the principle of using two capacitors, each of which has a discharging apparatus for discharging the capacitor, and each of which can be supplied with the signal being demodulated. At least one diode is in this case connected upstream of each of the capacitors. The polarity of the diode in this case depends on the polarity of the capacitors that are used. The switches which are connected in parallel with the first and second capacitors can be driven such that it is possible to compare an amplitude value of the modulated signal with a previous amplitude value in an evaluation unit.

Either immediately successive half-cycles of the signal being demodulated are stored alternately in the two capacitors, so that it is in each case possible to compare immediately successive half-cycles by comparing the capacitor voltages produced by the half-cycles. If, however, precise detection of level changes between two immediately successive half-cycles is not possible with sufficient accuracy at very high frequencies, it is also possible, by way of example, to compare only every second, third, fourth etc. half-cycle. In this case, by way of example, an amplitude of one specific half-cycle is stored in a first capacitor, and for example, the one after the next or third subsequent half-cycle is stored in a second capacitor, rather than the immediately subsequent half-cycle. Precise detection of an amplitude change between the half-cycles that are now stored is thus possible.

For one feasible use of the described demodulation principle in non-contacting smart cards, in which the measurable amplitude of a transmitted signal may depend not only on the modulation, but for example, also on the distance between the smart card and a fixed station, the principle of the described demodulation can be used particularly advantageously. This is because comparing the amplitudes of successive half-cycles allows an evaluation that is largely independent of the relative position of the smart card with respect to a fixed station, while comparing detected amplitudes with reference values could lead to errors.

The described principle is suitable for any desired duty ratios of the modulation signal, since no significant discharge time constant is formed. This is because the described switches for discharging the first and second capacitors form low-impedance paths to ground when they are closed.

Depending on the embodiment of the evaluation unit, the described configuration makes it possible, for example, to derive either the envelope of the amplitude-modulated signal or a differentiated signal that is derived from the demodulated signal and indicates flank changes.

In one advantageous embodiment of the present invention, a changeover switch is provided, and is arranged between a diode and the capacitors. This third switch makes it possible to supply the signal being demodulated either to the first capacitor or to the second capacitor.

In one alternative embodiment of the present invention, a second diode is provided. In each case, one diode is connected upstream of each capacitor. The diode inputs can be supplied with a pair of differential signals. The diodes are biased in the same sense, and their flow directions are in each case switched.

In a further advantageous embodiment of the present invention, the first and second switches are NMOS transistor switches, which have the switching times required for high frequencies and form low-impedance paths for discharging the respective capacitors.

In one advantageous embodiment of the described method, immediately successive half-cycles of the rectified, amplitude-modulated signal being demodulated are connected alternately to the first and second capacitors. However, the circuit may also be driven such that, for example, only every third half-cycle is stored and compared. For the evaluation circuit, this additionally has the advantage that it can be designed for slower clock rates.

Other features which are considered as characteristic for the invention are set forth in the appended claims.

Although the invention is illustrated and described herein as embodied in a demodulation circuit and demodulation method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 4 is a diagram showing the time profiles of the input voltage and of the capacitor voltages indicated in FIG. 1.

DESCRIPTION OF THE PREFERRED EMBODIMENTS

Figure 1:
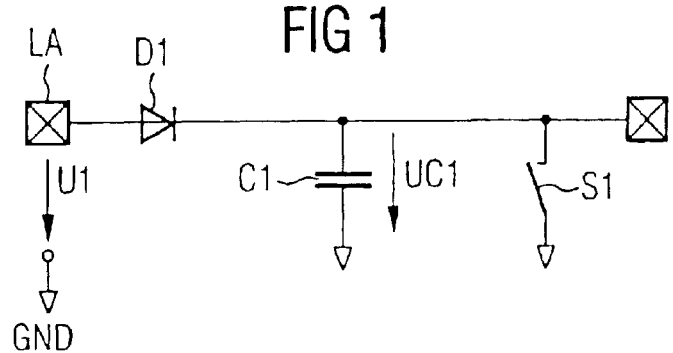
FIG. 1 is a block diagram of a first embodiment of an amplitude demodulation circuit.

Referring now to the figures of the drawing in detail and first, particularly, to FIG. 1 thereof, there is shown a circuit configuration having a first diode D1, to which an amplitude-modulated signal that will be demodulated can be supplied. A first capacitor C1 is connected to ground, downstream from the diode D1. A voltage that is present across the first capacitor C1 is annotated as UC1. A switch S1 is arranged in parallel with the first capacitor C1.

If the first capacitor C1 is charged by the positive half-cycles of the signal that is applied, then the switch S1 is in each case opened. This produces a very long time constant. During the phase in which the first diode D1 is reverse-biased, the first capacitor C1 can be discharged using the first switch S1. In this switching state, the time constant is very short. The first capacitor C1 can then be charged once again by the following half-cycle to its voltage maximum. The voltage values that are respectively associated with the half-cycles of the signal being demodulated and stored in the first capacitor can be detected and evaluated in an evaluation unit, which is not shown in FIG. 1. It is thus possible to demodulate the signal.

Figure 2:
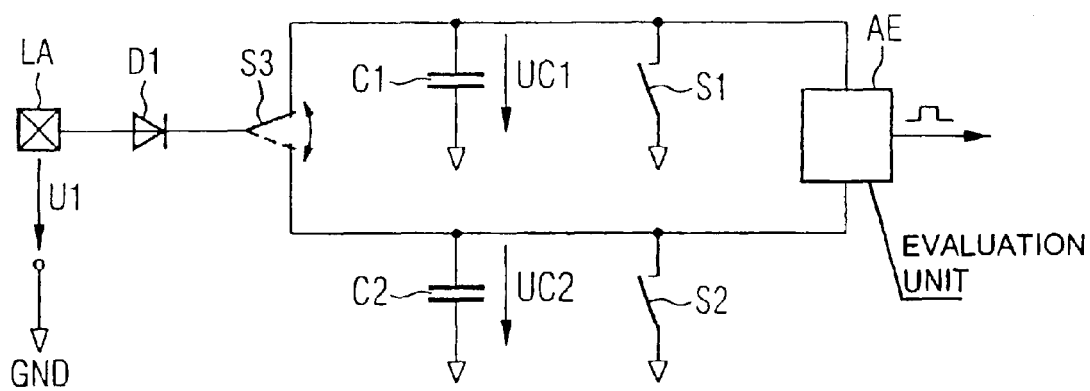
FIG. 2 is a block diagram of a second embodiment of an amplitude demodulation circuit.

FIG. 2 shows a circuit configuration having a first capacitor C1 and a second capacitor C2. An amplitude-modulated signal being demodulated is rectified in a first diode D1, which is connected upstream of the capacitors C1, C2. In this case, the signal can be supplied at a connection LA to the first diode D1, which in the present example is reverse-biased. A changeover switch S3 is arranged at the output of the first diode D1. This changeover switch S3 connects the output of the diode either to a second connection of the first capacitor C1 or to a second connection of the second capacitor C2. The respective first connection of the capacitors C1, C2 is connected to ground. The voltage across the first capacitor is annotated UC1, and the voltage across the second capacitor is annotated UC2. A first switch S1 is arranged in parallel with the first capacitor. A second switch S2 is arranged in parallel with the second capacitor. The input signal U1 being demodulated has a voltage U1 with respect to ground. Based on the circuitry for the first diode D1, the capacitors C1, C2 are supplied only with positive voltages. The capacitors C1, C2 are followed by an evaluation unit AE for comparing the capacitor voltages UC1, UC2. A demodulated signal can be tapped off on the evaluation unit AE.

The function of the circuit shown in FIG. 2 becomes clearer by reviewing the time profiles (as illustrated in FIG. 4) of the input voltage U1 and of the capacitor voltages UC1, UC2. The upper part of FIG. 4 shows the time profile of the rectified input signal U1. This shows that the amplitude of the half-cycles can assume two different values, as is normal in the case of digital modulation. In this case, one amplitude value may represent a first logic state, and a second amplitude value, which is not the same as the first amplitude value, may represent a second logic state. The amplitude-modulated square-wave function which has the actual information content is indicated by the voltage U1 over the voltage profile of the signal being demodulated. The time profiles of the capacitor voltages are shown in the lower part of FIG. 4. In this case, UC1 denotes the voltage profile across a first capacitor, and UC2 denotes the voltage profile across a second capacitor. It can be seen that the second capacitor C2 is charged by the first half-cycle of the input voltage U1. While the second capacitor C2 is still charged to its maximum value, the first capacitor C1 is charged by the second half-cycle. It is now possible to compare the voltages across the first and second capacitors. However, since there is no significant discrepancy between these voltages, no change in the signal level is detected. After comparing the capacitor voltages, the second capacitor C2 is now discharged by closing the switch S2, and is then once again charged to the maximum value, with the voltage U1, with the third half-cycle of the input signal. The second half-cycle can now be compared with the third half-cycle. However, no amplitude change can be detected in this case either. In consequence, the capacitors C1, C2 are charged alternately with half-cycles of the input voltage U1. A comparison of the first capacitor voltage with the second capacitor voltage at the time T1 shows an amplitude difference ΔU1. In consequence, the state of the modulation signal has changed from high to low. A change in the signal level likewise occurs at the time T2. This is represented by the voltage difference ΔU2 between the capacitor voltage across the first and second capacitors, whose voltage difference is formed at the time T2. The capacitor voltages UC1, UC2 are compared in an evaluation unit AE, and a demodulated signal can be tapped off from the evaluation unit AE.

The capacitors C1 and C2 are thus charged alternately to the maximum value of the voltage U1 minus the voltage which is dropped across the first diode D1. The voltage across a capacitor C1, C2 must in each case be maintained until the respective other capacitor C2, C1 is charged by the subsequent half-cycle of the input signal. Before one or the two capacitors is or are subsequently discharged by the switches S1, S2, the voltage UC1, UC2 which is present across the first capacitor C1 or across the second capacitor C2, respectively, is compared in an evaluation unit AE, in order to detect any change which may have occurred in the amplitude of the modulated signal. The circuit in FIG. 2 does not show the drive for the switches S1, S2, S3. However, a suitable drive for the switches can easily be derived from the signal profile of the voltages shown in FIG. 4.

Figure 3:
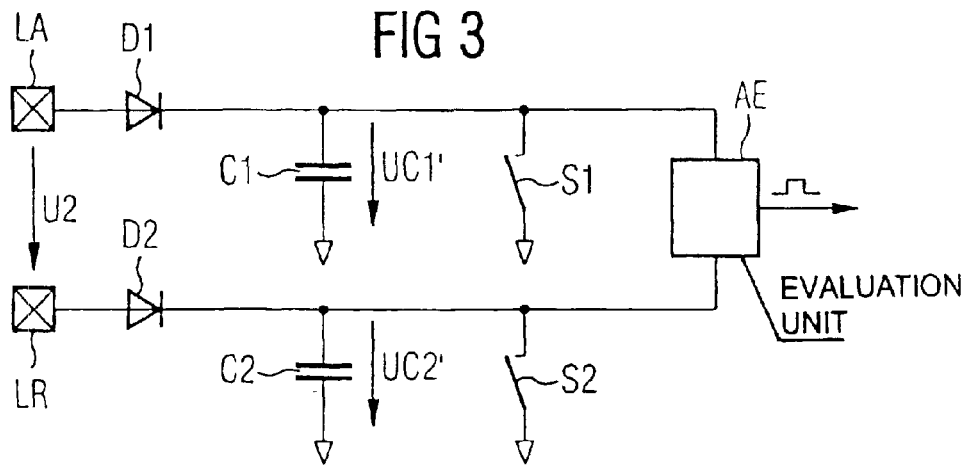
FIG. 3 is a block diagram of a third embodiment of an amplitude demodulation circuit.

FIG. 3 shows an outline block diagram of a circuit configuration which is matched to the situation where the amplitude-modulated signal being demodulated is a difference signal. The pair of differential signals at the voltage U2 can in this case be supplied to the pair of terminals LA, LR. The terminal LA is a first connection of a first diode D1, whose output is connected to a first capacitor C1. A first switch S1 is connected to ground, in parallel with the first capacitor C1. A voltage which is present across the first capacitor is annotated UC1'. A second diode D2 is connected to a second terminal connection LR. The second diode D2 is followed by a second capacitor C2, one of whose connections is connected to ground. A second switch S2 is arranged in parallel with the second capacitor. A voltage UC2' can be tapped off across the second capacitor C2. The circuit shown in FIG. 3 does not require a changeover switch S3 since a differential input voltage is present here, which is a radio frequency amplitude-modulated voltage. The comparison of the capacitor voltages UC1, UC2 is carried out in an evaluation unit AE, on which a demodulated signal can be tapped off.

The basic functional principle of the circuit shown in FIG. 3 corresponds to that of the circuit shown in FIG. 2. The first and second switches S1, S2 in the circuit shown in FIG. 3 are driven in accordance with the principle described with reference to FIG. 2. The half-cycles of the applied difference signal are alternately stored in the capacitors C1, C2, and the amplitudes which are stored in the form of a voltage value in the capacitors C1, C2 for each of the half-cycles are compared with one another. In this case, once again, immediately successive half-cycles may in each case be compared with one another, or every second or third etc. half-cycle may in each case be stored and compared. The comparison of the amplitude values makes it possible to demodulate the amplitude-modulated signal.

The described exemplary embodiments allow simple and precise demodulation of an amplitude-modulated signal. Only a very small number of components are required for the circuits in order to implement the described demodulation principle. Such circuits can thus be produced with little complexity. Since the capacitors are discharged by switches and not by resistors, which lead to charging time constants, the described principle can be used even at high frequencies.

We claim:

1. An amplitude demodulation circuit, comprising:
   a signal input for obtaining an amplitude-modulated signal;
   a first capacitor for obtaining a signal derived from the amplitude-modulated signal, said first capacitor having a first connection connected to ground, said first capacitor for supplying a first voltage being tapped off across said first capacitor;
   a first discharging apparatus connected in parallel with said first capacitor;
   a second capacitor for obtaining a signal derived from the amplitude-modulated signal, said second capacitor having a first connection connected to ground, said second capacitor for supplying a second voltage being tapped off across said second capacitor;
   a second discharging apparatus connected in parallel with said second capacitor;
   a device for alternately storing rectified successive half-cycles of the amplitude-modulated signal on said first capacitor and said second capacitor, said device coupling said first capacitor and said second capacitor to said signal input, and said device having a diode;
   a switch connected between said diode and said first capacitor and between said diode and said second capacitor, said switch having a first switch position for connecting said diode to said first capacitor and a second switch position for connecting said diode to said second capacitor; and
   an evaluation unit for comparing the first voltage and the second voltage and for supplying an amplitude-demodulated signal derived from the amplitude-modulated signal.

2. The amplitude demodulation circuit according to claim 1, wherein:
   said first discharging apparatus is an NMOS transistor switch; and
   said second discharging apparatus is an NMOS transistor switch.

3. A method for demodulating an amplitude-modulated signal, which comprises:
   supplying the amplitude-modulated signal to a diode;
   obtaining a rectified signal by rectifying the amplitude-modulated signal;
   charging a first capacitor to a first capacitor voltage with a first half-cycle of the rectified signal;
   charging a second capacitor to a second capacitor voltage with a second half-cycle of the rectified signal;
   providing a switch connected between the diode and the first capacitor and between the diode and the second capacitor;
   alternately connecting immediately successive half-cycles of the rectified signal to the first capacitor in a first switch position and to the second capacitor in a second switch position of the switch;
   comparing the first capacitor voltage and the second capacitor voltage and detecting any amplitude change;
   discharging the first capacitor; and
   discharging the second capacitor.

4. An amplitude demodulation circuit, comprising:
   a signal input having two terminals for obtaining and processing an amplitude-modulated differential signal;
   a first capacitor for obtaining a signal derived from the amplitude-modulated signal, said first capacitor having a first connection connected to ground, said first capacitor having a second connection, and said first capacitor for
   supplying a first voltage being tapped off across said first capacitor;
   a first discharging apparatus connected in parallel with said first capacitor;
   a second capacitor for obtaining a signal derived from the amplitude-modulated signal, said second capacitor having a first connection connected to ground, said second capacitor having a second connection, and said second capacitor for supplying a second voltage being tapped off across said second capacitor;
   a second discharging apparatus connected in parallel with said second capacitor;
   a device for alternately storing rectified successive half-cycles of the amplitude-modulated signal on said first capacitor and said second capacitor, said device having a first diode connected between one of said two terminals of said signal input and said second connection of said first capacitor, and said device having a second diode connected between the other of said two terminals of said signal input and said second connection of said second capacitor; and
   an evaluation unit for comparing the first voltage and the second voltage and for supplying an amplitude-demodulated signal derived from the amplitude-modulated signal.

5. The amplitude demodulation circuit according to claim 4, wherein:
   said first discharging apparatus is an NMOS transistor switch; and
   said second discharging apparatus is an NMOS transistor switch.

6. A method for demodulating an amplitude-modulated signal, which comprises:
   providing a signal input having two terminals for obtaining and processing an amplitude-modulated differential signal;
   supplying the amplitude-modulated signal to a first diode connected to one of the two terminals of the signal input and to a second diode connected to the other of the two terminals of the signal input;
   obtaining a rectified signal by rectifying the amplitude-modulated signal with the first and second diodes;
   charging a first capacitor connected to the first diode to a first capacitor voltage with a first half-cycle of the rectified signal;
   charging a second capacitor connected to the second diode to a second capacitor voltage with a second half-cycle of the rectified signal;
   comparing the first capacitor voltage and the second capacitor voltage and detecting any amplitude change;
   discharging the first capacitor; and
   discharging the second capacitor.

\* \* \* \* \*